(12) United States Patent
Sei

(10) Patent No.: US 6,919,632 B2
(45) Date of Patent: Jul. 19, 2005

(54) SEMICONDUCTOR INTEGRATED CIRCUIT DEVICE WITH I/O CELL AND CONNECTION MEMBER

(75) Inventor: Toshikazu Sei, Kawasaki (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 0 days.

(21) Appl. No.: 10/254,659

(22) Filed: Sep. 26, 2002

(65) Prior Publication Data

US 2003/0057549 A1 Mar. 27, 2003

(30) Foreign Application Priority Data

Sep. 27, 2001 (JP) ........................................ 2001-297047

(51) Int. Cl.[7] .............................................. H01L 23/34
(52) U.S. Cl. ...................... 257/723; 257/724; 257/725; 257/726
(58) Field of Search ........................ 257/280, 723–725, 257/691

(56) References Cited

U.S. PATENT DOCUMENTS

| | | | | | |
|---|---|---|---|---|---|
| 4,811,073 A | * | 3/1989 | Kitamura et al. | ........... | 257/203 |
| 4,868,630 A | * | 9/1989 | Tanizawa et al. | ........... | 257/203 |
| 4,883,980 A | * | 11/1989 | Morimoto et al. | ............ | 326/47 |
| 4,920,398 A | * | 4/1990 | Yoshio et al. | ................ | 257/369 |
| 5,060,046 A | * | 10/1991 | Shintani | ...................... | 257/206 |
| 6,287,482 B1 | | 9/2001 | Hamura et al. | | |

FOREIGN PATENT DOCUMENTS

| | | | | | |
|---|---|---|---|---|---|
| JP | 01238140 A | * | 9/1989 | ........... | H01L/21/82 |
| JP | 03147349 A | * | 6/1991 | ........... | H01L/21/82 |

* cited by examiner

*Primary Examiner*—Hoai Pham
*Assistant Examiner*—Nathan W. Ha
(74) *Attorney, Agent, or Firm*—Oblon, Spivak, McClelland, Maier & Neustadt, P.C.

(57) ABSTRACT

A semiconductor integrated circuit device includes connection members arranged on an entire chip, a first I/O cell which is arranged on the periphery of the chip and has a first end portion on the peripheral side of the chip and a second end portion on the center side of the chip, a second I/O cell which is arranged inside the first I/O cell and has a third end portion on the peripheral side of the chip and a fourth end portion on the center side of the chip, first terminals formed on the first end portion and connected to the connection members, second terminals formed on the second end portion and connected to an internal circuit of the chip, third terminals formed on the third end portion and connected to the internal circuit, and fourth terminals formed on the fourth end portion and connected to the connection members.

17 Claims, 16 Drawing Sheets

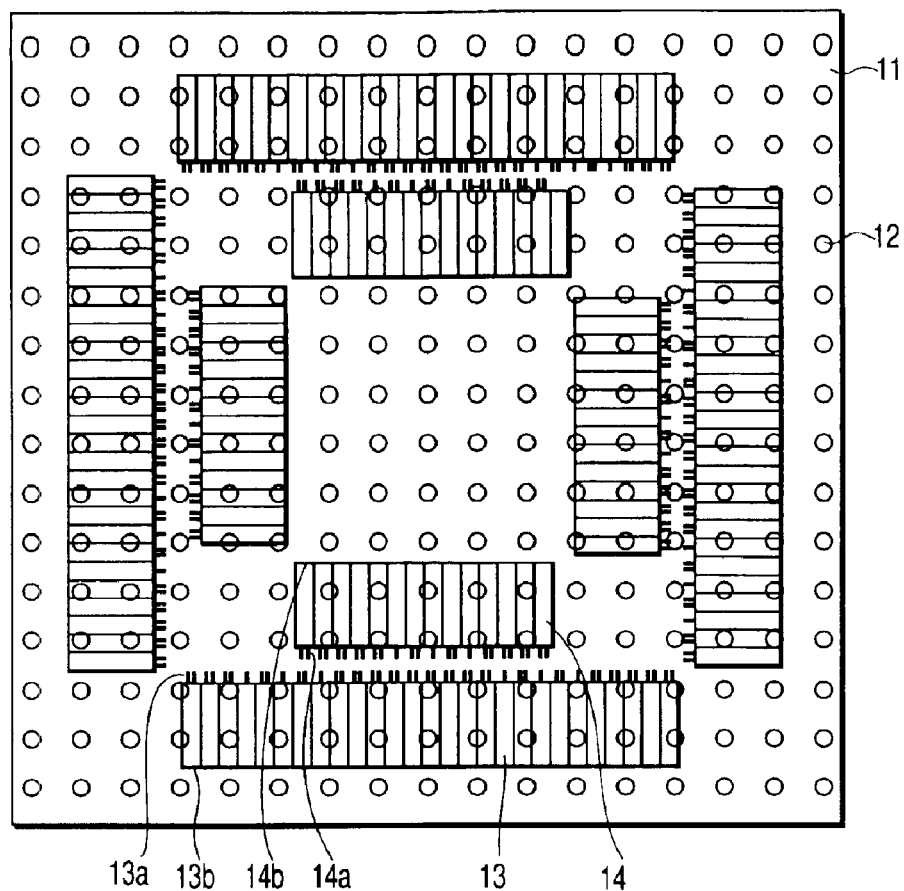
F I G. 1
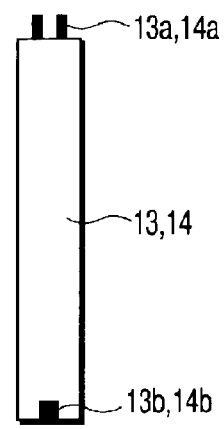
F I G. 2

SEMICONDUCTOR INTEGRATED CIRCUIT DEVICE WITH I/O CELL AND CONNECTION MEMBER

CROSS-REFERENCE TO RELATED APPLICATIONS

This application is based upon and claims the benefit of priority from the prior Japanese Patent Application No. 2001-297047, filed Sep. 27, 2001, the entire contents of which are incorporated herein by reference.

BACKGROUND OF THE INVENTION

1. Field of the Invention

The present invention relates to a flip-chip type semiconductor integrated circuit device in which pads are arranged on an entire semiconductor chip to connect the semiconductor chip to a package.

2. Description of the Related Art

Conventionally, there has been provided a flip-chip type semiconductor integrated circuit device in which pads are arranged on an entire semiconductor chip to connect the semiconductor chip to a package.

FIG. 16 shows a plan view of a flip-chip type semiconductor integrated circuit device according to the first prior art. FIG. 17 shows a partially enlarged view of the semiconductor integrated circuit device shown in FIG. 16. Interconnections are omitted in FIG. 16. The flip-chip type semiconductor integrated circuit device according to the first prior art will be described below.

As shown in FIG. 16, pads (or bumps) 12 for electrical connection to a package (not shown) are arranged on an entire chip 11, and rectangular I/O cells 13 are arranged along the sides of the chip 11. The pads 12 on the center of the chip 11 are used for supplying a power supply voltage and ground potential to an internal circuit, and the pads 12 on the peripheral portion of the chip 11 are used for supplying signals, a power supply voltage, and a ground potential to the I/O cells 13. Internal signal terminals 13a connected to the internal circuit of the chip 11 are formed on the end portion of each I/O cell 13 on the center side of the chip 11, and an external signal terminal 13b connected to each pad 12 is formed on the end portion of each I/O cell 13 on the peripheral side of the chip 11.

As shown in FIG. 17, since a distance between the pads 12 is longer than the length of a general I/O cell 13, the pads 12 in a plurality of columns are assigned to the I/O cells 13 in one column. The pads 12 and the external signal terminals 13b of the I/O cells 13 are connected to interconnections 15. The interconnections 15 are formed from only one uppermost layer which is a thickest layer, or two layers, the uppermost and next layers. The pads 12 on the center of the chip 11 are respectively connected to power supply interconnections 17 and ground interconnections 18.

In the first prior art described above, when the number of signal terminals must be increased along with an increase in number of the input/output signals, since the I/O cells 13 are arranged along the sides of the chip 11, the chip 11 must be enlarged to increase the number of I/O cells 13 that can be arranged. To increase the number of signal terminals without enlarging the chip 11, the following second prior art is disclosed.

FIG. 18 shows a plan view of a flip-chip type semiconductor integrated circuit device according to the second prior art. FIG. 19 shows a partially enlarged view of the semiconductor integrated circuit device shown in FIG. 18. Interconnections are omitted in FIG. 18. The flip-chip type semiconductor integrated circuit device according to the second prior art will be described below.

As shown in FIG. 18, similar to the first prior art, pads 12 for electrical connection to a package (not shown) are arranged on an entire chip 11, and rectangular first I/O cells 13 are arranged along the sides of the chip 11. In addition, second I/O cells 14 are arranged inside the first I/O cells 13. This enables, without enlarging the chip 11, to arrange the I/O cells 13 and 14 larger in number than those in the first prior art, thereby increasing the number of signal terminals.

In the second prior art described above, as shown in FIG. 19, some second interconnections 16 which connect the second I/O cells 14 to the pads 12 on the center of the chip 11 are long, resulting in an increase in resistance and capacitance of each prolonged second interconnection 16. In addition, the second interconnections 16 connecting the second I/O cells 14 to the pads 12 and the first interconnections 15 connecting the first I/O cells 13 to the pads 12 are crowded on the narrow regions between the pads 12 above the second I/O cells 14. When the plurality of interconnections 15 and 16 are crowded in such narrow regions, and in particular, the interconnections 15 and 16 are formed from only one uppermost metal interconnection region, no interconnections 15 and 16 having an enough width each can be formed.

As described above, in the first and second prior arts, it is difficult to shorten the interconnections 15 and 16 and relax the crowd thereof while increasing the number of I/O cells 13 and 14.

BRIEF SUMMARY OF THE INVENTION

A semiconductor integrated circuit device according to an aspect of the present invention comprises a chip, connection members arranged on the entire chip, a first I/O cell which is arranged on a periphery of the chip and has a first end portion on a peripheral side of the chip and a second end portion on a center side of the chip, a second I/O cell which is arranged inside the first I/O cell and has a third end portion on the peripheral side of the chip and a fourth end portion on the center side of the chip, first terminals formed on the first end portion and connected to the connection members, second terminals formed on the second end portion and connected to an internal circuit of the chip, third terminals formed on the third end portion and connected to the internal circuit of the chip, and fourth terminals formed on the fourth end portion and connected to the connection members.

BRIEF DESCRIPTION OF THE SEVERAL VIEWS OF THE DRAWING

FIG. 1 is a plan view showing a semiconductor integrated circuit device according to the first embodiment of the present invention;

FIG. 2 is a plan view showing the I/O cell of the semiconductor integrated circuit device according to the first embodiment of the present invention;

DETAILED DESCRIPTION OF THE INVENTION

Figure 3:
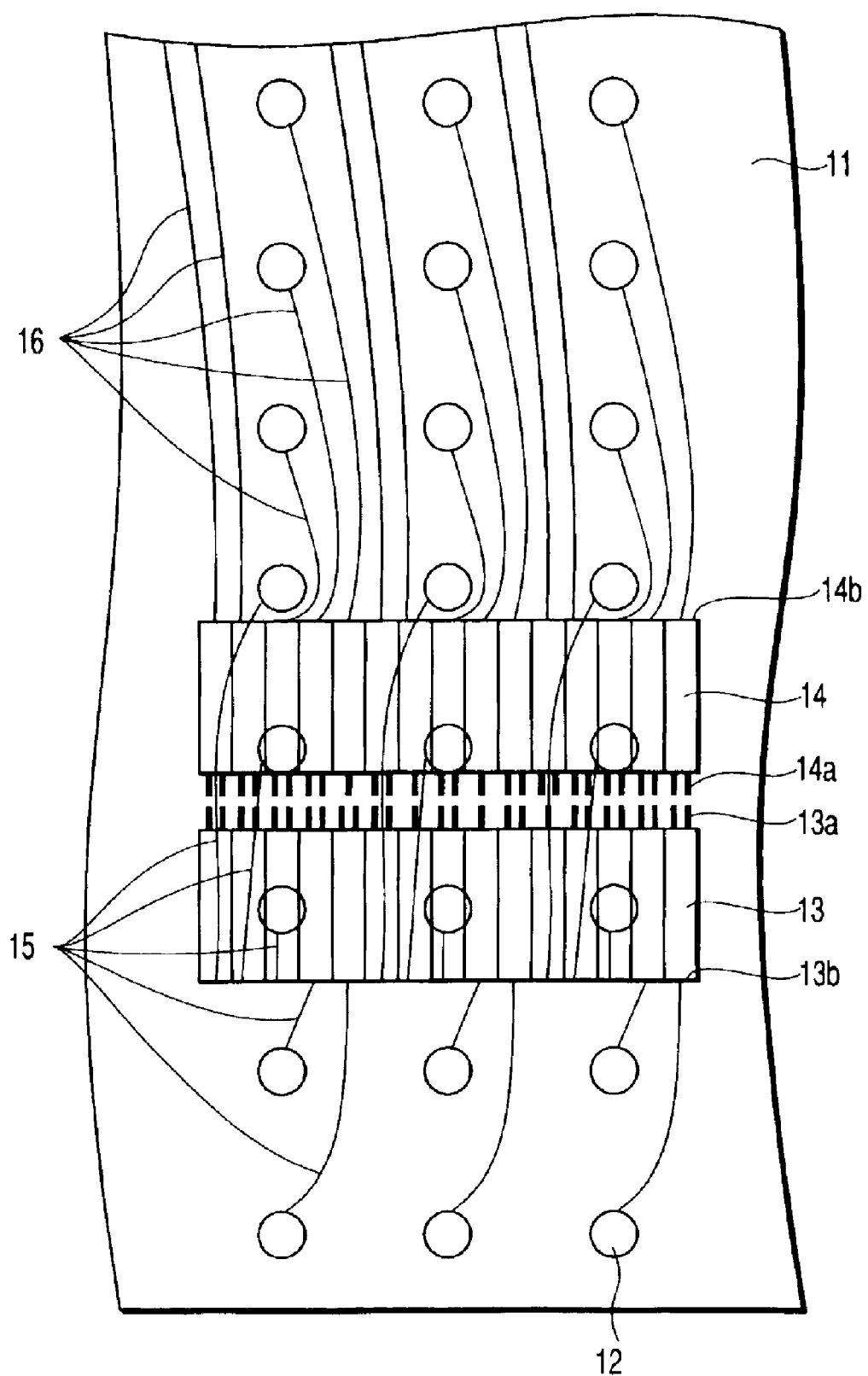
FIG. 3 is a partially enlarged view of the semiconductor integrated circuit device shown in FIG. 1.

Embodiments of the present invention are related to a flip-chip type semiconductor integrated circuit device in which pads are arranged on an entire semiconductor chip to connect the semiconductor chip to a package.

The embodiments of the present invention will be described below with reference to the accompanying drawing. In this description, the same reference numerals in all the drawings denote the same parts.

[First Embodiment]

The first embodiment describes an example in which the internal signal terminals of I/O cells on the outer and inner sides of a chip face each other.

FIG. 1 shows a plan view of a semiconductor integrated circuit device according to the first embodiment of the present invention. FIG. 2 shows an enlarged view of an I/O cell shown in FIG. 1. FIG. 3 shows a partially enlarged view of the semiconductor integrated circuit device shown in FIG. 1. Interconnections are omitted in FIG. 1. The flip-chip type semiconductor integrated circuit device according to the first embodiment will be described below.

As shown in FIGS. 1 and 2, a plurality of lattice pads (or connection members such as bumps) 12 for electrical connection to a package (not shown) are arranged on an entire chip 11 in a matrix. Rectangular first I/O cells 13 are arranged along the sides of the chip 11, and second I/O cells 14 are arranged inside the first I/O cells 13. The first I/O cell 13 has a plurality of first I/O cells which are arranged to be adjacent to each other on each side of the chip 11. Similarly, the second I/O cell 14 has a plurality of second I/O cells which are arranged to be adjacent to each other on each side of the chip 11.

Internal signal terminals 13a connected to the internal circuit of the chip 11 are formed on the end portion of each first I/O cell 13 on the center side of the chip 11, and an external signal terminal 13b connected to each pad 12 is formed on the end portion of each first I/O cell 13 on the peripheral side of the chip 11. Internal signal terminals 14a connected to the internal circuit of the chip 11 are formed on the end portion of each second I/O cell 14 on the peripheral side of the chip 11, and an external signal terminal 14b connected to each pad 12 is formed on the end portion of each second I/O cell 14 on the center side of the chip 11. That is, since the direction of the first I/O cell 13 is opposite to that of the second I/O cell 14, the internal signal terminals 13a of the first I/O cell 13 and the internal signal terminals 14a of the second I/O cell 14 face each other.

As shown in FIG. 3, the pads 12 on the peripheral side of the chip 11 (e.g., the pads 12 in the first to fifth columns from each side of the chip 11) are connected to the external signal terminals 13b of the first I/O cells 13 via first interconnections 15. The pads 12 arranged inside the pads connected to the external signal terminals 13b of the first I/O cells 13 (e.g., the pads 12 in the sixth to 10th columns) are connected to the external signal terminals 14b of the second I/O cells 14 via second interconnections 16. These interconnections 15 and 16 are formed from only one uppermost layer which is a thickest layer, or two layers, the uppermost and next layers. The pads 12 arranged near the first and second I/O cells 13 and 14 are used for supplying external signals, a power supply voltage, and a ground potential to the I/O cells 13 and 14. The pads 12 arranged on the center of the chip 11 are used for supplying a power supply voltage and ground potential to the internal circuit.

According to the first embodiment of the present invention, the external signal terminals 14b of the second I/O cells 14 are located inside the chip. This can shorten the second interconnection 16 by the length of the second I/O cell 14 as compared with the second prior art. Therefore, the interconnection can be prevented from increasing its resistance and capacitance along with interconnection prolonging.

In addition, since the external signal terminal 14b of each second I/O cell 14 is formed on the center side of the chip 11, the second interconnections 16 need not run across the second I/O cells 14 upon connecting the pads 12 to the second I/O cells 14. This can relax the crowd of the first and second interconnections 15 and 16 above the second I/O cells 14. Therefore, even if the first and second interconnections 15 and 16 are formed from only one uppermost metal interconnection layer, they can have a desired enough width each.

Further, the first I/O cells 13 are arranged along the sides of the chip 11, and the second I/O cells 14 are arranged inside the first I/O cells 13. This can arrange I/O cells 13 and 14 larger in number than that in the first prior art without enlarging the chip 11, thereby increasing the number of signal terminals. Therefore, the number of input/output signals can be increased.

As described above, according to the first embodiment, the semiconductor integrated circuit device can be realized with a high degree of integration and good electrical characteristics.

Figure 4:
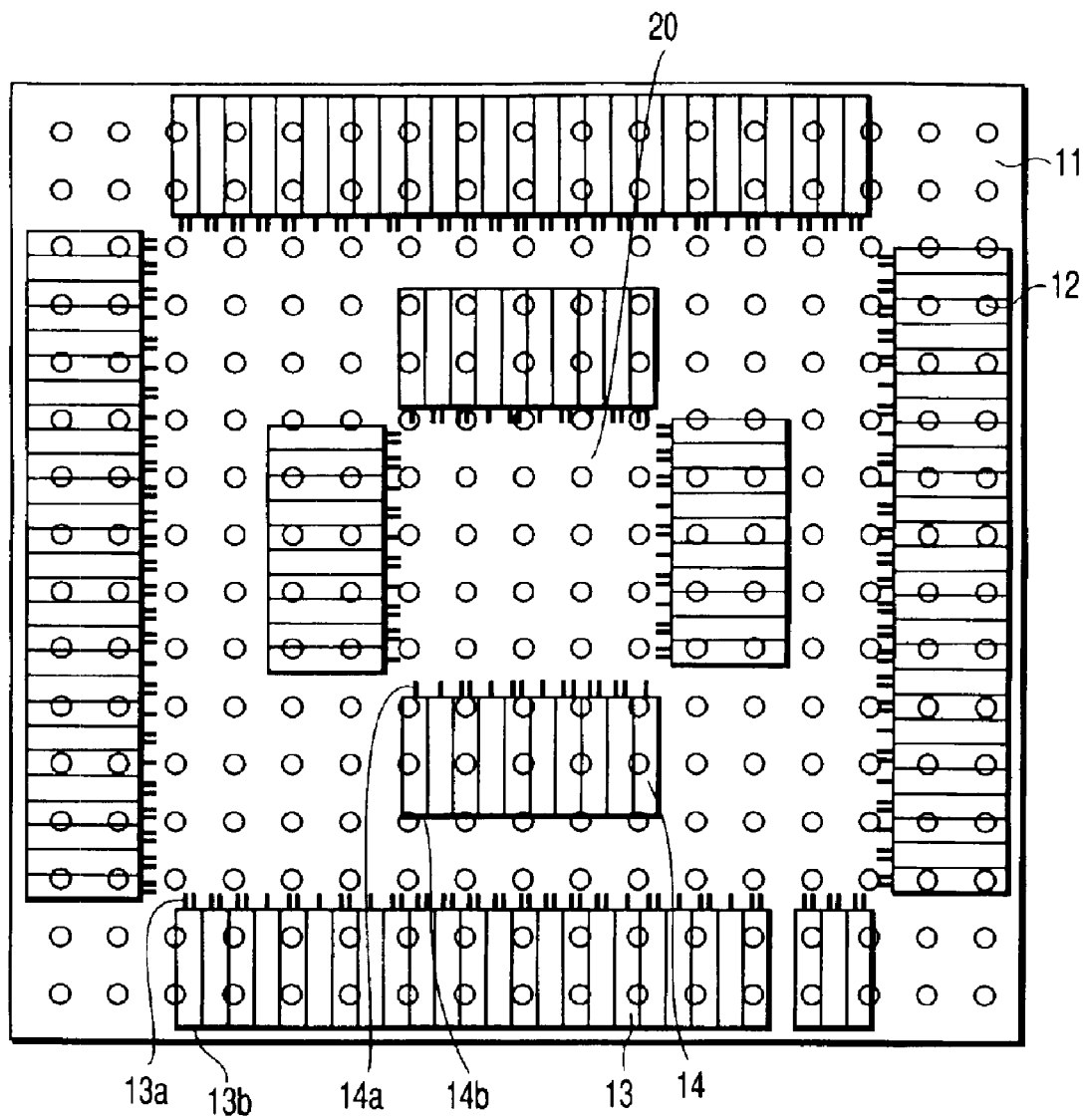
FIG. 4 is a plan view showing another semiconductor integrated circuit device according to the first embodiment of the present invention.
Figure 5:
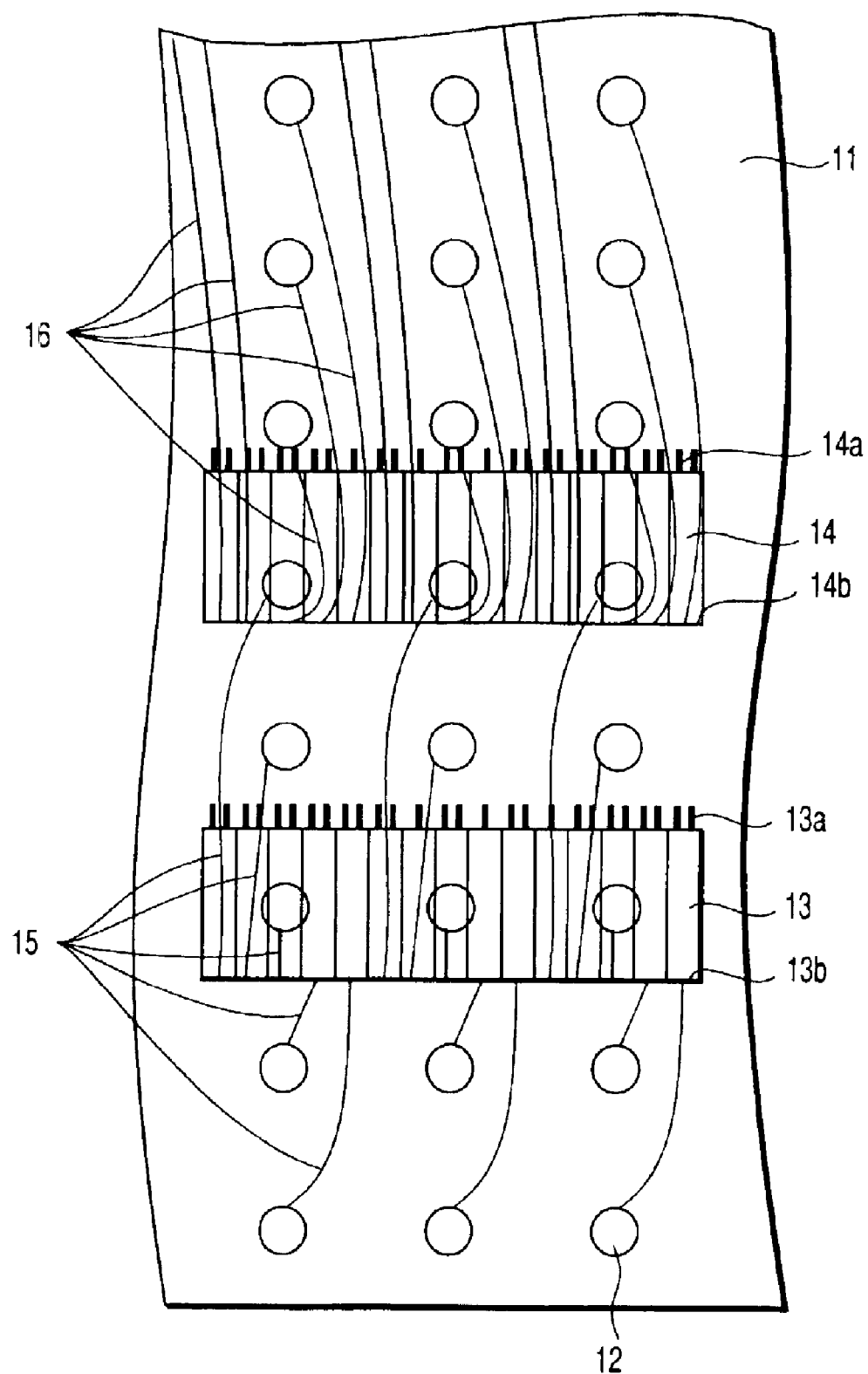
FIG. 5 is a partially enlarged view of the semiconductor integrated circuit device shown in FIG. 4.

Note that as shown in FIGS. 4 and 5, even when the terminals of the first and second I/O cells 13 and 14 face the same direction, if the second I/O cells 14 are arranged close to the center of the chip 11, the interconnections can be shortened and the crowd thereof can be relaxed as in the first embodiment. However, this structure reduces an internal circuit region 20 for the internal circuit on the center of the chip 11. Thus, the structure shown in FIGS. 1 to 3 can ensure an internal circuit region 20 of the chip 11 larger than that in the structure shown in FIGS. 4 and 5.

[Second Embodiment]

As described in the first embodiment, the pads 12 arranged near the I/O cells 13 and 14 are used for supplying not only the external signals but also a power supply voltage and ground potential to the I/O cells 13 and 14. This is because a current flowing in the I/O cells 13 and 14 which drive an external circuit outside the chip 11 is larger than that flowing in the internal circuit, so the parasitic resistances of power supply interconnections connected to the I/O cells 13 and 14 must be reduced.

Several power supply systems are used for the I/O cells 13 and 14 because power supply voltages are different, noise is prevented from bypassing, and the like. Accordingly, some power supply systems used for the I/O cell 13 or 14 need not be supplied a power supply voltage from the pad 12 far away from the cell 13 or 14 because the power supply system is also used as that for the internal circuit, and the power consumption is small.

As the structure shown in FIG. 1, even if the I/O cells 13 and 14 are respectively arranged without any gap and all the I/O cells 13 and 14 are connected to the pads 12, all the pads 12 connected to the I/O cells 13 and 14 cannot be connected to the outer pins of a package depending on the pad pitch or package specifications such as the number of package substrate layers or the interconnection pitch. In this case, some I/O cells 13 and 14 are not connected to the external pins.

Under these circumstances, in the second embodiment, a plurality of second I/O cells 14 are arranged with partial gaps.

Figure 6:
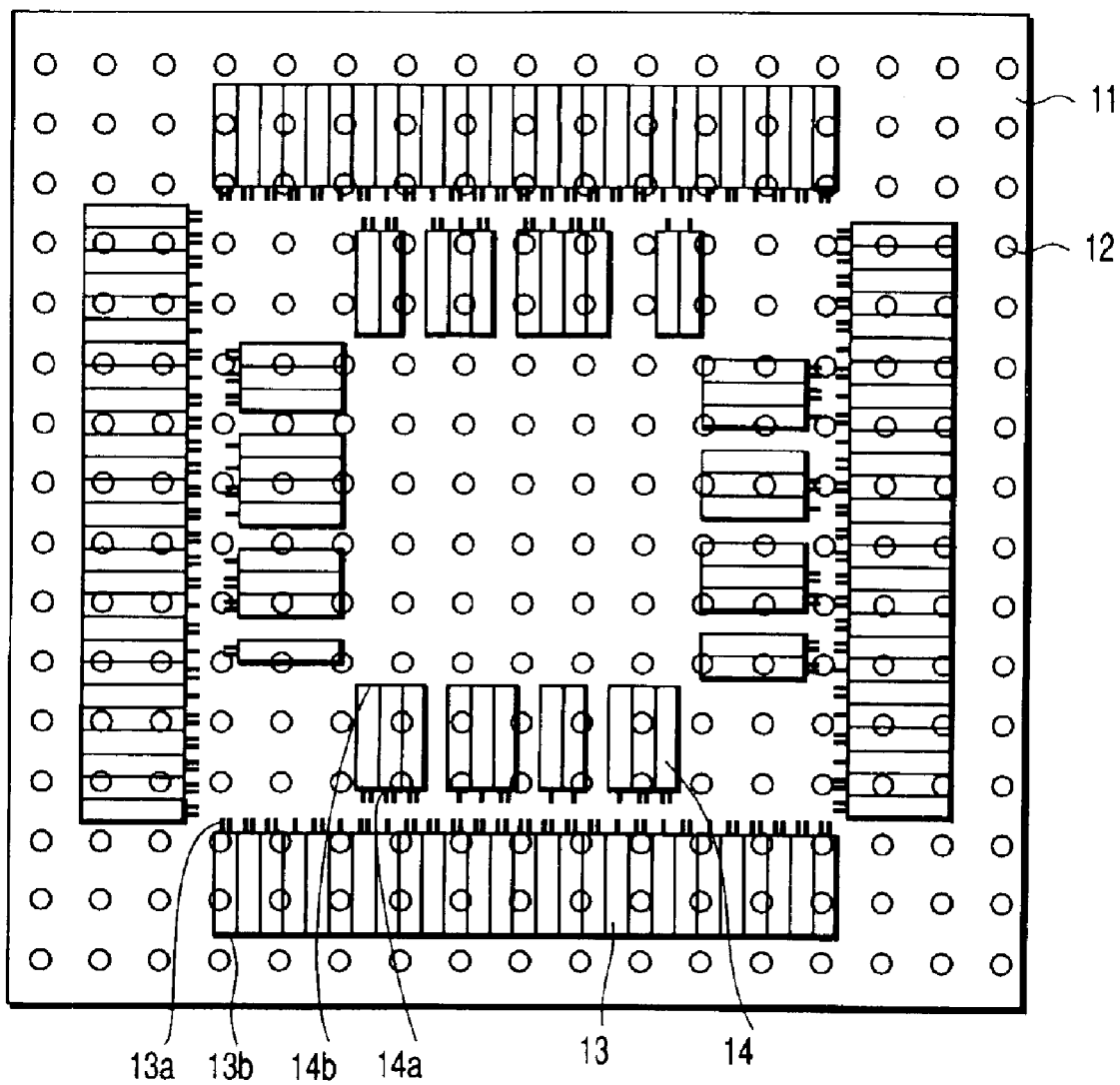
FIG. 6 is a plan view showing a semiconductor integrated circuit device according to the second embodiment of the present invention.
Figure 7:
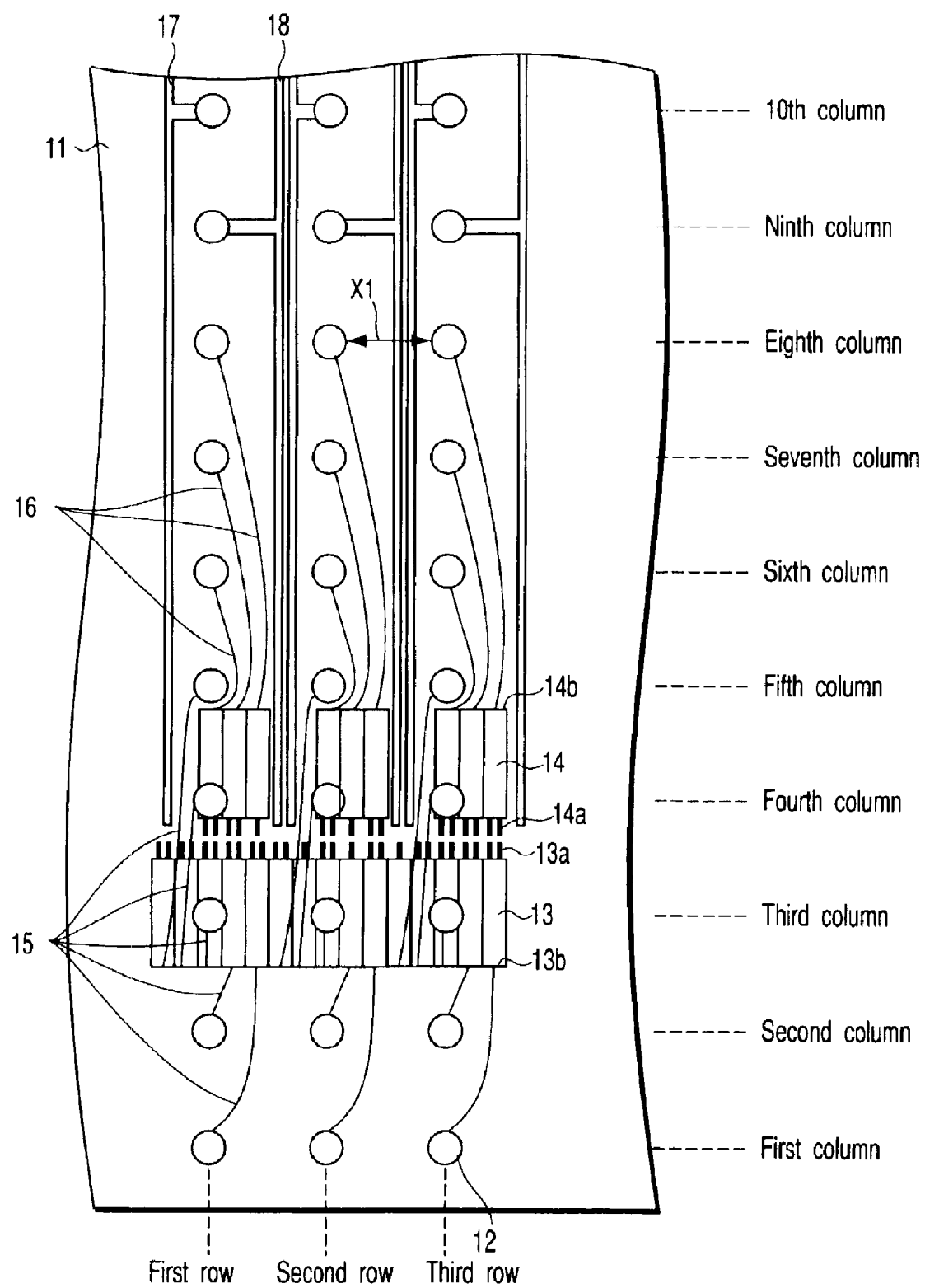
FIG. 7 is a partially enlarged view of the semiconductor integrated circuit device shown in FIG. 6.

FIG. 6 shows a plan view of a semiconductor integrated circuit device according to the second embodiment of the present invention. FIG. 7 shows a partially enlarged view of the semiconductor integrated circuit device shown in FIG. 6. Interconnections are omitted in FIG. 6. The flip-chip type semiconductor integrated circuit device according to the second embodiment will be described below. In the second embodiment, only the structure different from that in the semiconductor integrated circuit device according to the first embodiment will be described.

As shown in FIG. 6, first and second I/O cells 13 and 14 are arranged such that internal signal terminals 13a of the first I/O cells 13 and internal signal terminals 14a of the second I/O cells 14 face each other. In this case, on each side of a chip 11, the first I/O cells 13 are adjacently arranged without any gap while the second I/O cells 14 are adjacently arranged with partial gaps.

More specifically, as shown in FIG. 7, pads 12 in the first to eighth columns from one side of the chip 11 are respectively connected to the I/O cells 13 and 14, and the pads 12 in the ninth column and subsequent columns are respectively connected to power supply interconnections 17 and ground interconnections 18 which are used for supplying a power supply voltage and ground potential to an internal circuit. The power supply interconnections 17 and ground interconnections 18 for the internal circuit run from the center of the chip 11 to near the internal signal terminals 13a of the first I/O cells 13 via the gaps in the second I/O cells 14. Although not shown, the power supply interconnections 17 and ground interconnections 18 are connected to the first and second I/O cells 13 and 14. The power supply interconnections 17 and ground interconnections 18 are used for supplying a power supply voltage and ground potential to not only the internal circuit but also the first and second I/O cells 13 and 14.

In this case, since some second I/O cells 14 are eliminated, the first I/O cells 13 are larger in number than the second I/O cells 14. Thus, the pads 12 connected to the first I/O cells 13 are larger in number than those connected to the second I/O cells 14.

The gaps in the second I/O cells 14 correspond to positions at which noneffective I/O cells of the second I/O cells 14 which are not connected to the external pins are present. More specifically, the gaps between adjacent second I/O cells 14 are formed in the space between every adjacent rows, e.g., the space between the pads 12 in the first and second rows, the space between the pads 12 in the second and third rows. In other words, pads in one row use one power supply interconnection 17 and one ground interconnection 18.

According to the second embodiment, the same effects as in the first embodiment can be obtained.

In addition, gaps are formed in the second I/O cells 14, so that the power supply interconnections 17 and ground interconnections 18 for the internal circuit can be arranged near the first and second I/O cells 13 and 14 while running via the gaps in the second I/O cells 14. Therefore, the power supply or ground for the internal circuit can also be used for the first and second I/O cells 13 and 14.

Assume that the I/O cells 13 and 14 are adjacently arranged, the pads 12 in the fourth column near the I/O cells 13 and 14 are connected to the power supply interconnections 17 and ground interconnections 18, and the pads 12 in the first to third columns and fifth to ninth columns are connected to the I/O cells 13 and 14. In this case, as in the second embodiment, the power supply for the internal circuit can also be used for the I/O cells 13 and 14. However, since some interconnections 15 and 16 which connect the I/O cells 13 and 14 to the pads 12 prolong in this structure, causing problems in the electrical characteristic in these prolonged interconnections. The problems of the lengths of the interconnections 15 and 16 can be improved by locating the second I/O cells 14 closer to the center of the chip 11 than the above-described case, but this results in a decrease in region for the internal circuit. Therefore, the structure shown in FIGS. 6 and 7 is preferable to realize both good electrical characteristics and a high degree of integration.

[Third Embodiment]

A large ESD (Electro Static Destruction) protective element and output transistor are included in an I/O cell 13 or 14, which are connected to an external signal terminal 13b or 14b. In the third embodiment, the external signal terminal 13b or 14b is not arranged on the end portion of the I/O cell 13 or 14, but arranged on the center of the I/O cell 13 or 14 which has the ESD protective element and output transistor.

Figure 8:
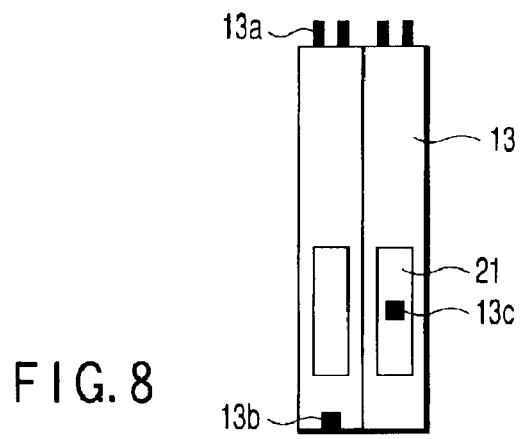
FIG. 8 is a plan view showing the I/O cell of a semiconductor integrated circuit device according to the third embodiment of the present invention.
Figure 9:
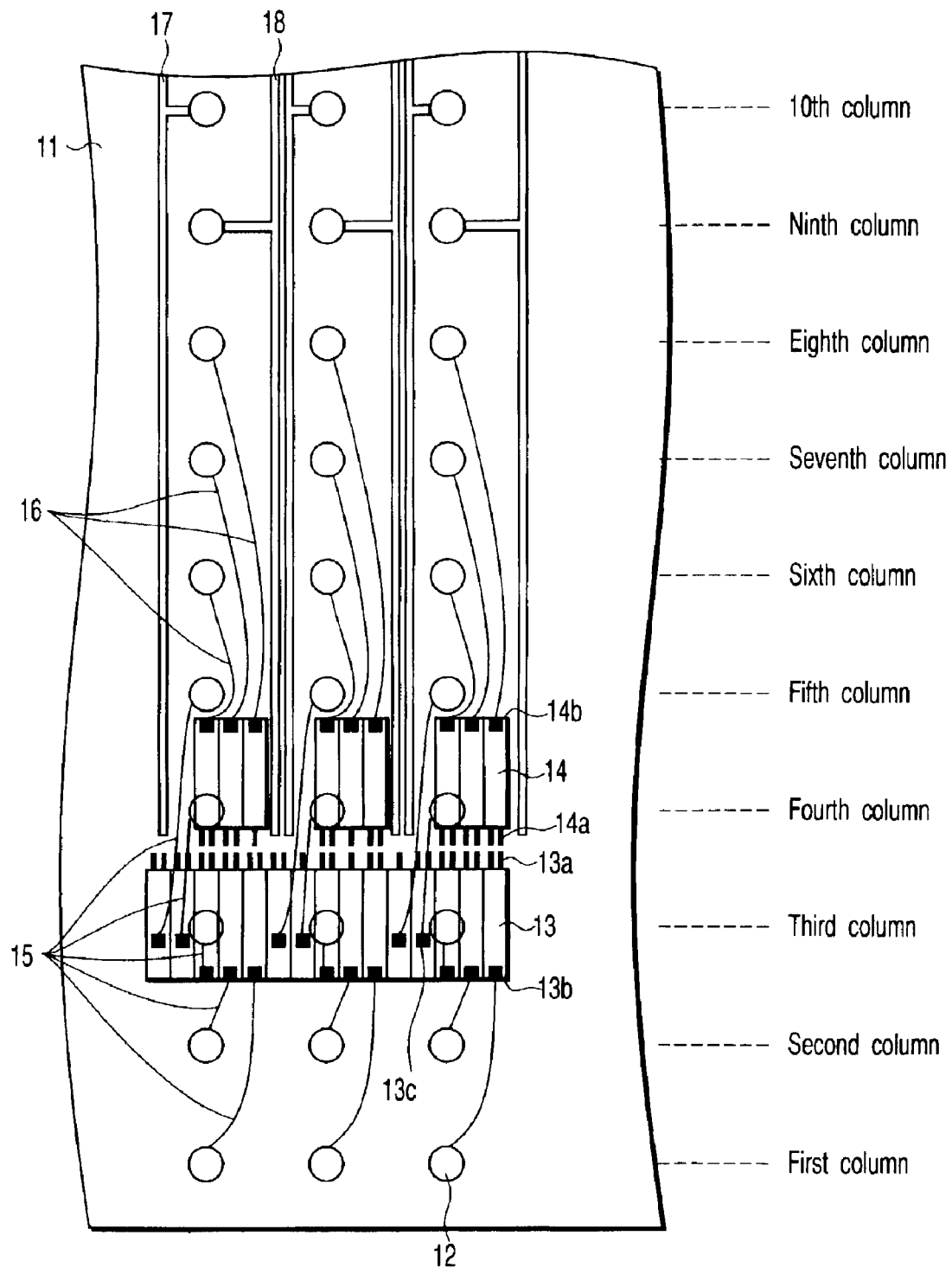
FIG. 9 is a plan view showing the semiconductor integrated circuit device according to the third embodiment of the present invention.

FIG. 8 shows a plan view of an I/O cell according to the third embodiment of the present invention. FIG. 9 shows a partial plan view of a semiconductor integrated circuit device according to the third embodiment of the present invention. The flip-chip type semiconductor integrated circuit device according to the third embodiment will be described below. In the third embodiment, only the structure different from those in the semiconductor integrated circuit devices according to the first and second embodiments will be described.

As shown in FIG. 8, in the third embodiment, there is provided an I/O cell 13 in which internal signal terminals 13a and a first external signal terminal 13b are respectively formed on its end portions, and an I/O cell 13 in which the internal signal terminals 13a are formed on its end portion and a second external signal terminal 13c is formed on its center. In this case, the center of the I/O cell 13 on which the second external signal terminal 13c is formed is an element region 21 in which the ESD protective element and output transistor are present.

More specifically, as shown in FIG. 9, pads 12 in the first to third columns from one side of a chip 11 are connected to the first external signal terminals 13b of the first I/O cells 13, pads 12 in the fourth and fifth columns are connected to the second external signal terminals 13c of the first I/O cells 13. That is, when the distance between the pad 12 and the center of the first I/O cell 13 is smaller than that between the pad 12 and the end portion of the first I/O cell 13 on the peripheral side of the chip 11, the second external signal terminal 13c is used.

According to the third embodiment of the present invention, the same effect as in the first and second embodiments can be obtained.

In addition, according to the third embodiment, since the external signal terminal 13b on the end portion of the first I/O cell 13 and the external signal terminal 13c on the center thereof are discriminately used, an interconnection 15 between the second external signal terminal 13c and pad 12 can be shortened. That is, in the structure shown in FIG. 9, the interconnections 15 which connect the first I/O cells 13 and the pads 12 in the fourth and fifth columns can be shortened.

Note that in FIG. 9, the third embodiment applies the structure based on that of the second embodiment, but may apply the structure based on that of the first embodiment.

In addition, the second external signal terminal 13c is formed only on the center of the first I/O cell 13 in the structure shown in FIG. 9. However, for example, when a second I/O cell 14 is arranged close to the center of the chip 11, the second external signal terminal may be formed on the center of the second I/O cell 14.

[Fourth Embodiment]

The fourth embodiment is applied when second I/O cells are not arranged inside first I/O cells on all sides of a chip.

Figure 10:
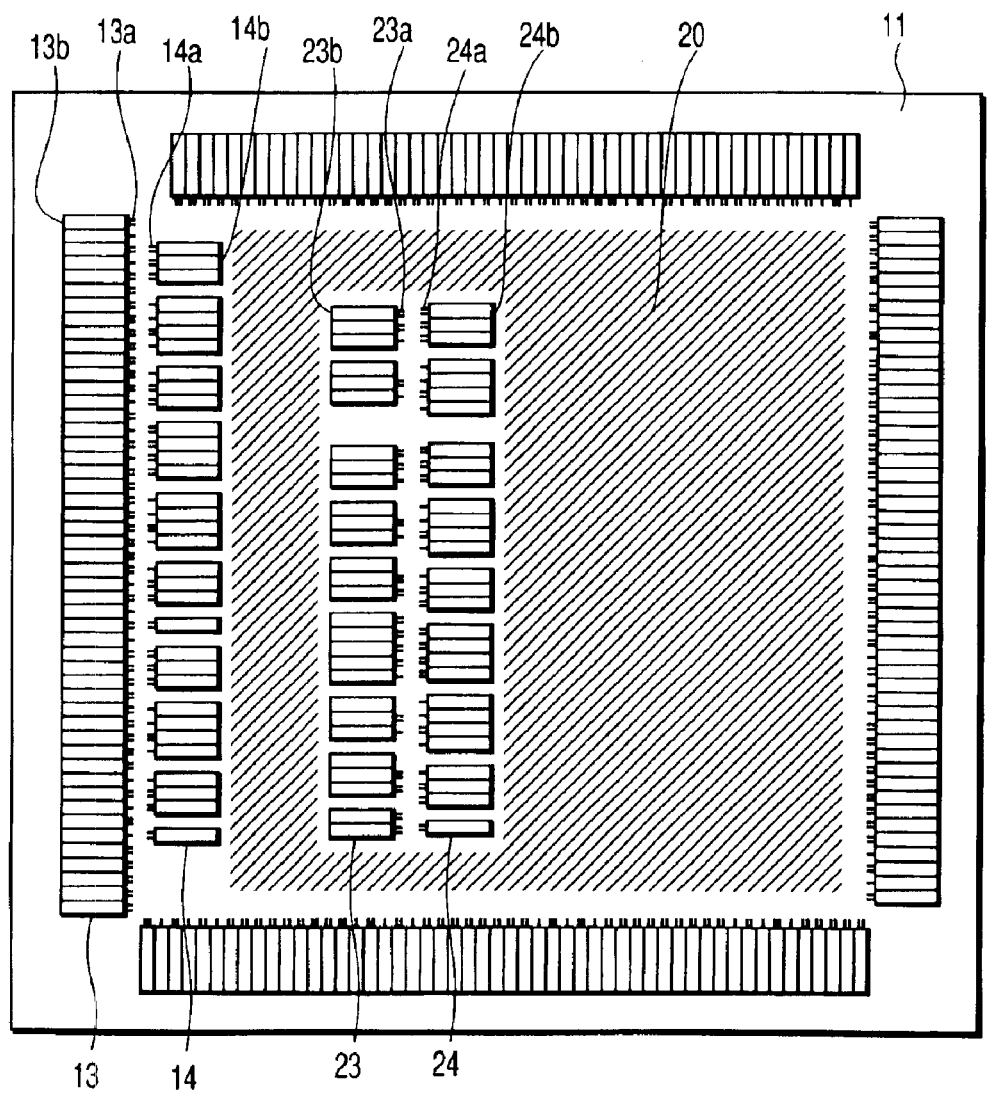
FIG. 10 is a plan view showing a semiconductor integrated circuit device according to the fourth embodiment of the present invention.
Figure 11:
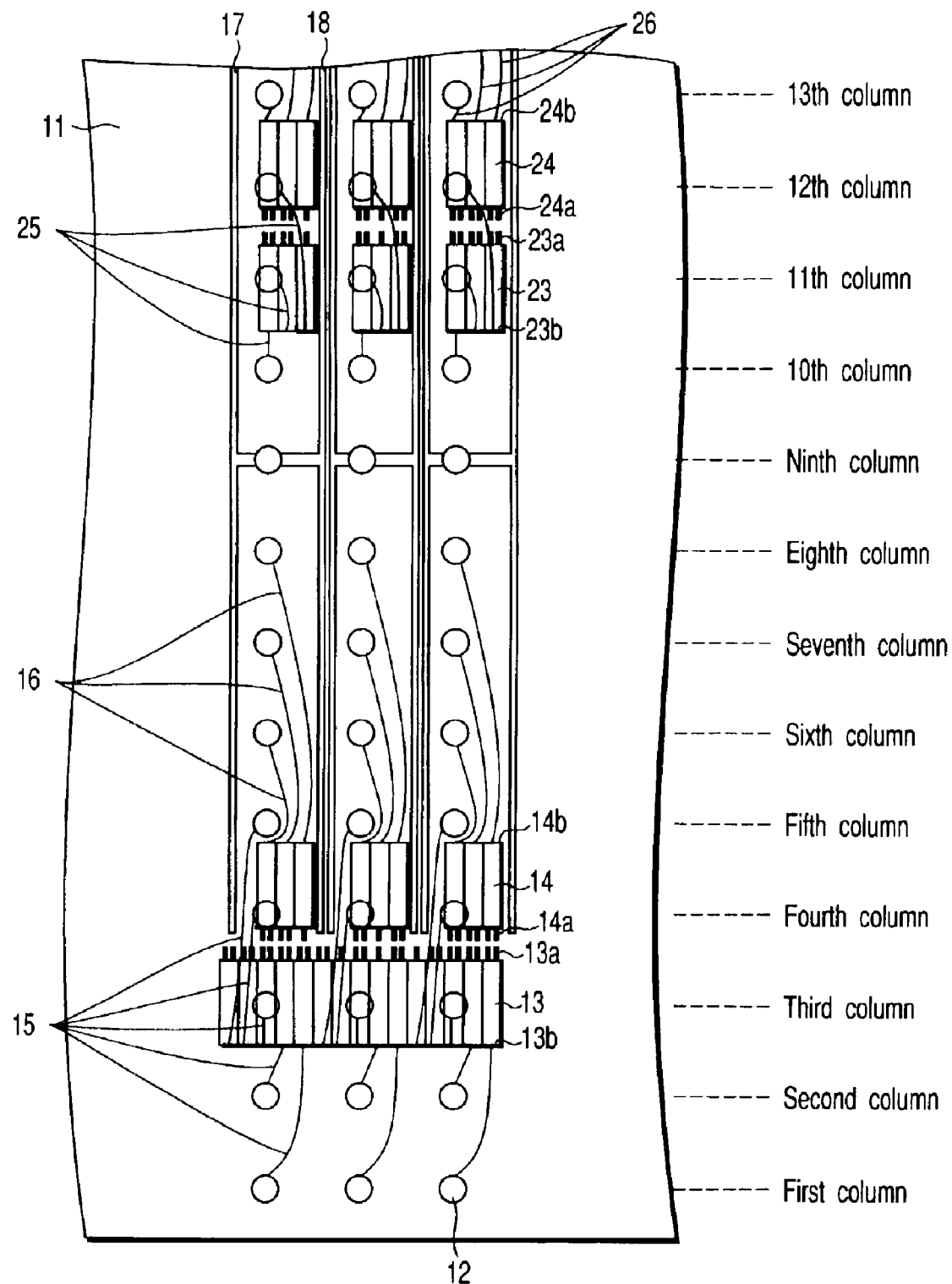
FIG. 11 is a partially enlarged view of the semiconductor integrated circuit device shown in FIG. 10.

FIG. 10 shows a plan view of a semiconductor integrated circuit device according to the fourth embodiment of the present invention. FIG. 11 shows a partially enlarged view of the semiconductor integrated circuit device shown in FIG. 10. Pads and interconnections are omitted in FIG. 10. The flip-chip type semiconductor integrated circuit device according to the fourth embodiment will be described below. In the fourth embodiment, only the structure different from those in the semiconductor integrated circuit devices according to the first and second embodiments will be described.

As shown in FIG. 10, first I/O cells 13 are arranged on the peripheral portion of a chip 11 along its four sides. A second I/O cell 14 is arranged inside one of the first I/O cells 13 in one side of the chip 11. A third I/O cell 23 is formed inside the second I/O cell 14 to be spaced therefrom by a predetermined interval, and a fourth I/O cell 24 is arranged inside the third I/O cell 23. The first I/O cell 13 has a plurality of first I/O cells which are arranged to be adjacent to each other on each side of the chip 11. The second I/O cell 14 has a plurality of second I/O cells which are arranged to be adjacent to each other on one side of the chip 11. The third I/O cell 23 has a plurality of third I/O cells which are arranged to be adjacent to each other on the side of the chip 11 where the second I/O cell 14 is present. The fourth I/O cell 24 has a plurality of fourth I/O cells which are arranged to be adjacent to each other on the side the chip 11 where the second I/O cell 14 is present. Each of the second to fourth I/O cells 14, 23, and 24 is arranged with partial gaps.

In this case, internal signal terminals 13a connected to the internal circuit of the chip 11 are formed on the end portion of each first I/O cell 13 on the center side of the chip 11, and an external signal terminal 13b connected to a pad is formed on the end portion of each first I/O cell 13 on the peripheral side of the chip 11. Internal signal terminals 14a connected to the internal circuit of the chip 11 are formed on the end portion of each second I/O cell 14 on the peripheral side of the chip 11, and an external signal terminal 14b connected to a pad is formed on the end portion of each second I/O cell 14 on the center side of the chip 11. That is, since the direction of the first I/O cell 13 is opposite to that of the second I/O cell 14, the internal signal terminals 13a of the first I/O cell 13 and the internal signal terminals 14a of the second I/O cell 14 face each other.

In the third I/O cell 23, internal signal terminals 23a connected to the internal circuit of the chip 11 are formed on the end portion on the fourth I/O cell 24 side, and an external signal terminal 23b connected to a pad is formed on the end portion on the second I/O cell 14 side. In the fourth I/O cell 24, internal signal terminals 24a connected to the internal circuit of the chip 11 are formed on the end portion on the third I/O cell 23 side, and an external signal terminal 24b connected to a pad is formed on the other end portion. That is, since the direction of the third I/O cell 23 is opposite to that of the fourth I/O cell 24, the internal signal terminals 23a of the third I/O cell 23 and the internal signal terminals 24a of the fourth I/O cell 24 face each other.

As shown in FIG. 11, pads 12 in the first to eighth columns from one side of the chip 11 are respectively connected to the external signal terminals 13b and 14b of the first and second I/O cells 13 and 14, and pads 12 in the 10th column and subsequent columns are respectively connected to the external signal terminals 23b and 24b of the third and fourth I/O cells 23 and 24. Pads 12 in the ninth column are connected to power supply interconnections 17 and ground interconnections 18. The power supply interconnections 17 and ground interconnections 18 for the internal circuit run from near the pads 12 in the ninth column to the vicinity of the internal signal terminals 13a of the first I/O cells 13 via the gaps in the second I/O cells 14, and reach the vicinity of the opposing peripheral portion of the chip 11 via the gags in the third and fourth I/O cells 23 and 24. Although not shown, the power supply interconnections 17 and ground interconnection 18 are connected to the first to fourth I/O cells 13, 14, 23, and 24. Therefore, the power supply interconnections 17 and ground interconnections 18 are used for supplying a power supply voltage and ground potential to not only the internal circuit but also the first to fourth I/O cells 13, 14, 23, and 24.

According to the fourth embodiment of the present invention, the same effect as in the first and second embodiments can be obtained.

In addition, even when the second I/O cells 14 are not arranged inside the first I/O cells 13 on all the sides of the chip 11, e.g., any element must be arranged to be adjacent to the first I/O cells 13 inside them, the fourth embodiment can shorten the interconnection. That is, since the internal signal terminals 23a of the third I/O cells 23 which are connected to the internal circuit face the center of the chip 11, the third I/O cells 23 are located near the fourth I/O cell 24 so as to be close to the center of the chip 11 where the internal circuit is present. With this arrangement, the fourth embodiment can shorten third and fourth interconnections 25 and 26, which respectively connect the third and fourth I/O cells 23 and 24 to the pads 12, without crowding the interconnections 25 and 26.

Further, when the distance between the second I/O cell 14 and third I/O cell 23 is prolonged, the region between them can be used as an internal circuit region 20 for the internal circuit. This can realize a high-integration chip 11.

Figure 12:
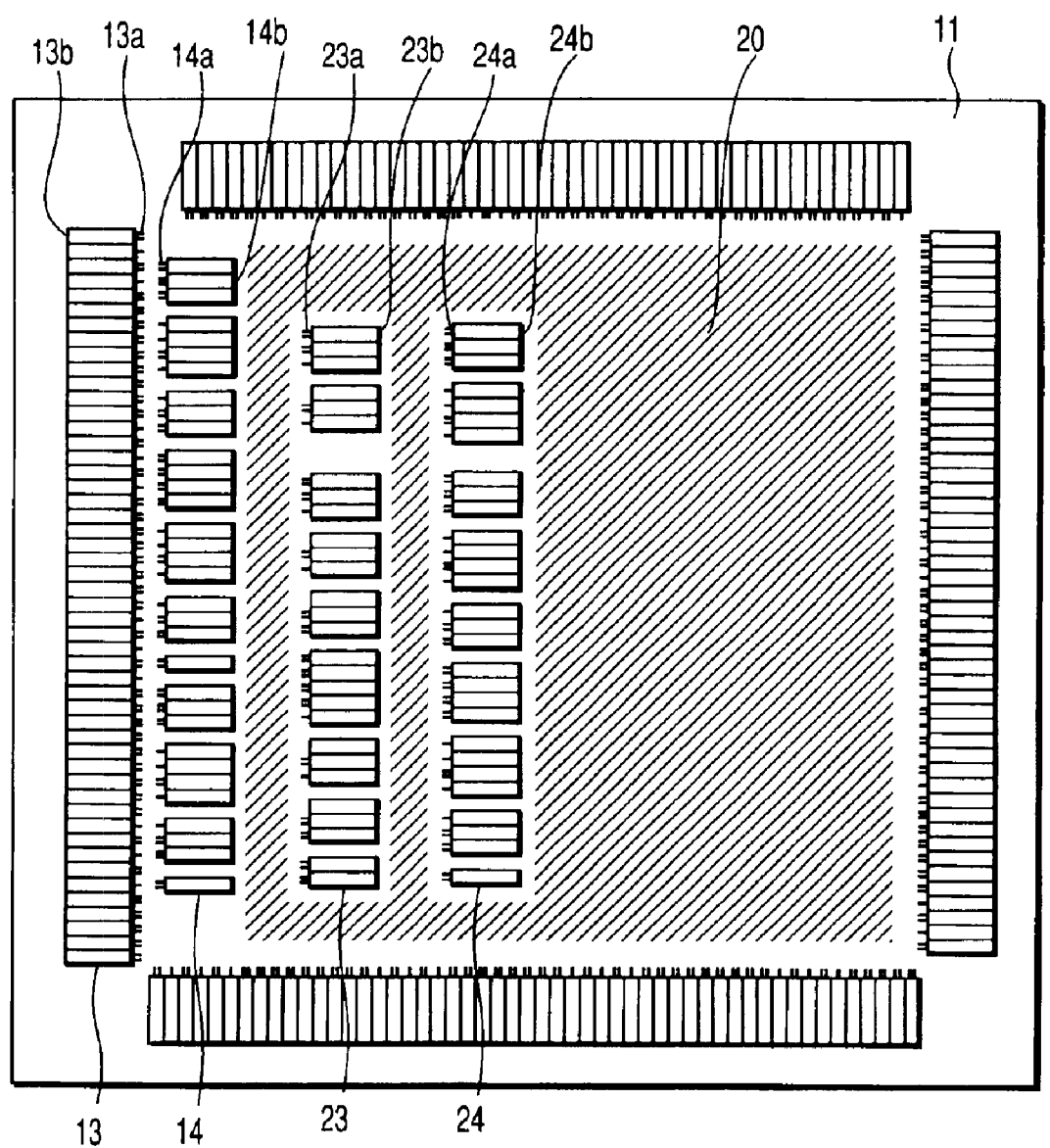
FIG. 12 is a plan view showing another semiconductor integrated circuit device according to the fourth embodiment of the present invention.

As shown in FIG. 12, even when the third cells 23 are arranged to face the same direction as that of the second I/O cells 14, if the third and fourth I/O cells 23 and 24 are spaced from each other by a small distance, an interconnection crowd can be relaxed, and the interconnections can be shortened, as in the fourth embodiment. However, this structure undesirably divides the internal circuit region 20 into a region between the second and third I/O cells 14 and 23 and a region between the third and fourth I/O cells 23 and 24. The structure shown in FIGS. 10 and 11 can ensure an internal circuit region 20 of the chip 11 larger than that in the structure shown in FIG. 12. That is, since the circuit can be formed in a large region, the degree of integration can be increased as compared with a case wherein the circuit is formed in the divided regions. In particular, the structure shown in FIGS. 10 and 11 enables to arrange a large cell such as a RAM which is not arranged in the divided small region.

In FIG. 10, the fourth embodiment applies the structure based on that of the second embodiment, but may apply the structure based on that of the first embodiment. The structure of the third embodiment can be similarly applied to the fourth embodiment.

[Fifth Embodiment]

In the fifth embodiment, a macrocell is arranged which requires to minimize the length of an interconnection which connects the macrocell to an external circuit outside a chip.

Figure 13:
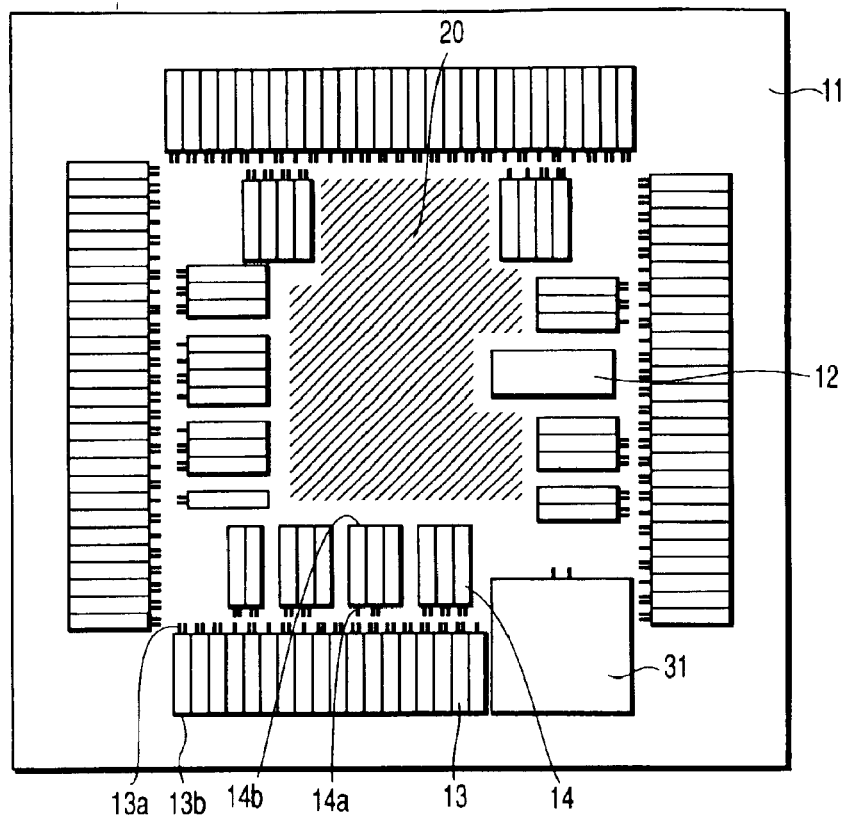
FIG. 13 is a plan view showing a semiconductor integrated circuit device according to the fifth embodiment of the present invention.

FIG. 13 shows a plan view of a semiconductor integrated circuit device according to the fifth embodiment of the present invention. Pads and interconnections are omitted in FIG. 13. The flip-chip type semiconductor integrated circuit device according to the fifth embodiment will be described below. In the fifth embodiment, only the structure different from those in the semiconductor integrated circuit devices according to the first and second embodiments will be described.

As shown in FIG. 13, first I/O cells 13 and second I/O cells 14 are formed on the four sides of a chip 11 such that internal signal terminals 13a of the first I/O cells 13 and internal signal terminals 14a of the second I/O cells 14 face each other. The second I/O cells 14 are arranged with partial gaps on each side of the chip 11.

A fifth I/O cell 31 is formed in the line of the first I/O cells 13 on the first side of the chip 11 to extend across the first and second I/O cells 13 and 14. The fifth I/O cell 31 is a cell integrated with an I/O cell, e.g., a macrocell made of a PLL (Phase-Locked Loop), AD converter, and DA converter. Internal signal terminals 31a and an external signal terminal 31b are formed on the end portions of the fifth I/O cell 31. The macrocell constructing the fifth I/O cell 31 is connected to an external circuit outside the chip 11 by using the external signal terminal 31b.

A sixth I/O cell 32 is arranged in the line of the second I/O cells 14 on the second side of the chip 11 to project more inside the chip 11 than the second I/O cells 14. Since the sixth I/O cell 32 is a cell independent of the I/O cells, it is arranged to be adjacent to the first I/O cell 13, and connected to the first I/O cell 13 to be connected to the external circuit.

An internal circuit region 20 spreads on the third side of the chip 11 to wedge into a portion of the line of the second I/O cells 14.

According to the fifth embodiment, the same effects as in the first and second embodiments can be obtained.

In addition, the fifth I/O cell 31 integrated with the I/O cell and the sixth I/O cell 32 independent of the I/O cell can be arranged to be adjacent to the first and second I/O cells 13 and 14. With this arrangement, since the fifth and sixth I/O cells 31 and 32 can be connected to the external circuit via short interconnections, stable power supply to the fifth and sixth I/O cells 31 and 32 and an decrease in interconnection resistance can be realized.

Note that in FIG. 13, the fifth embodiment applies the structure based on that of the second embodiment, but may apply the structure based on that of the first embodiment. The structure of the third embodiment can be similarly applied to the fifth embodiment.

[Sixth Embodiment]

The sixth embodiment exemplifies a case wherein so-called staggered pads are formed.

Figure 14:
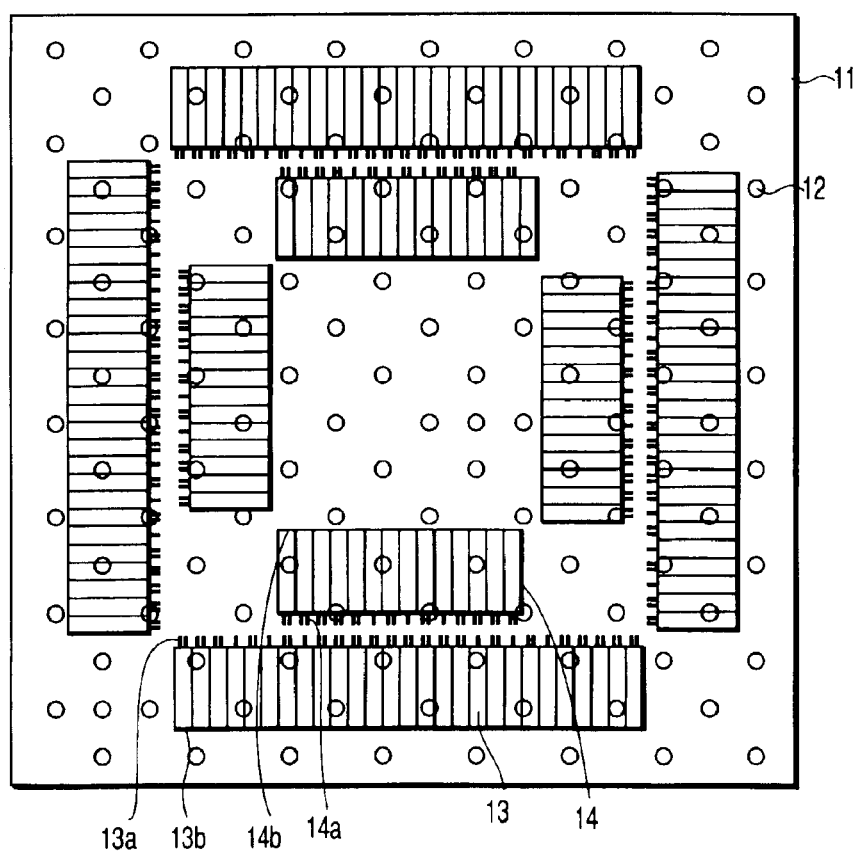
FIG. 14 is a plan view showing a semiconductor integrated circuit device according to the sixth embodiment of the present invention.
Figure 15:
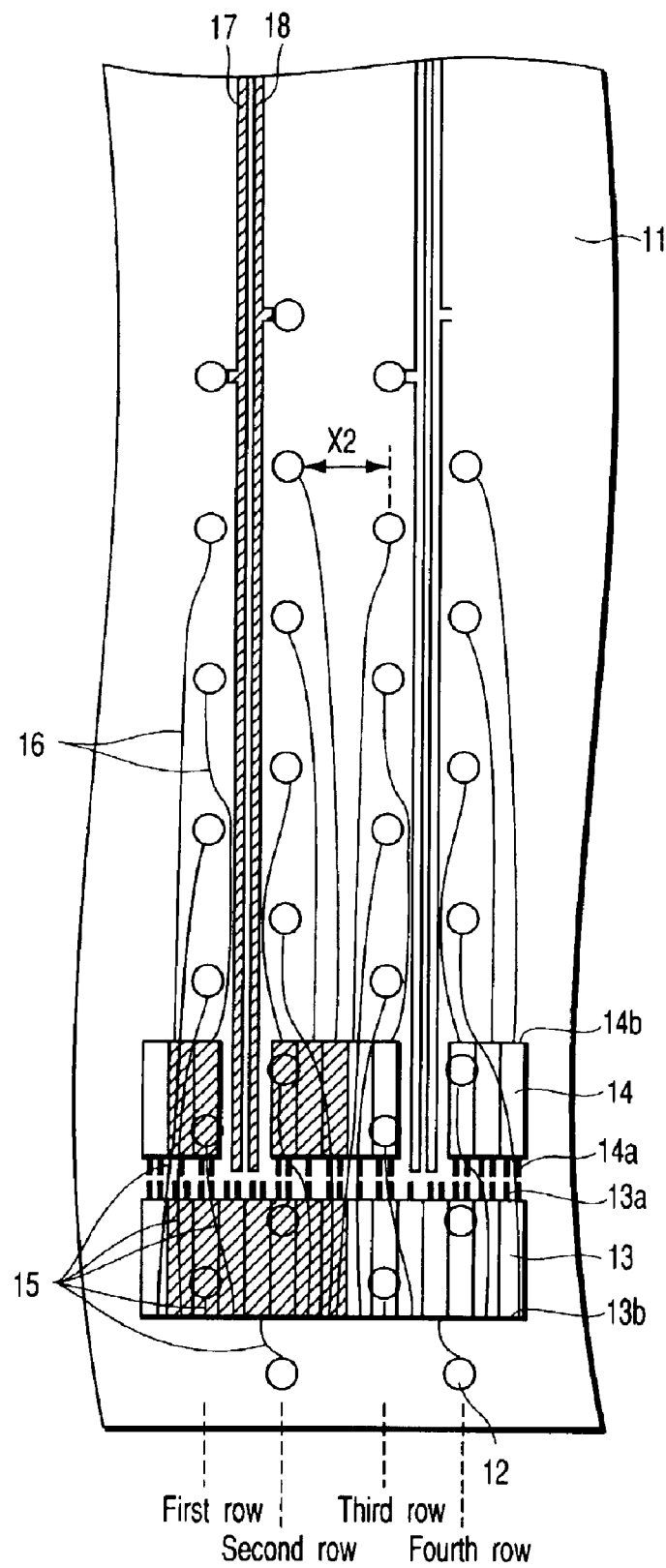
FIG. 15 is a partially enlarged view of the semiconductor integrated circuit device shown in FIG. 14.
Figure 16:
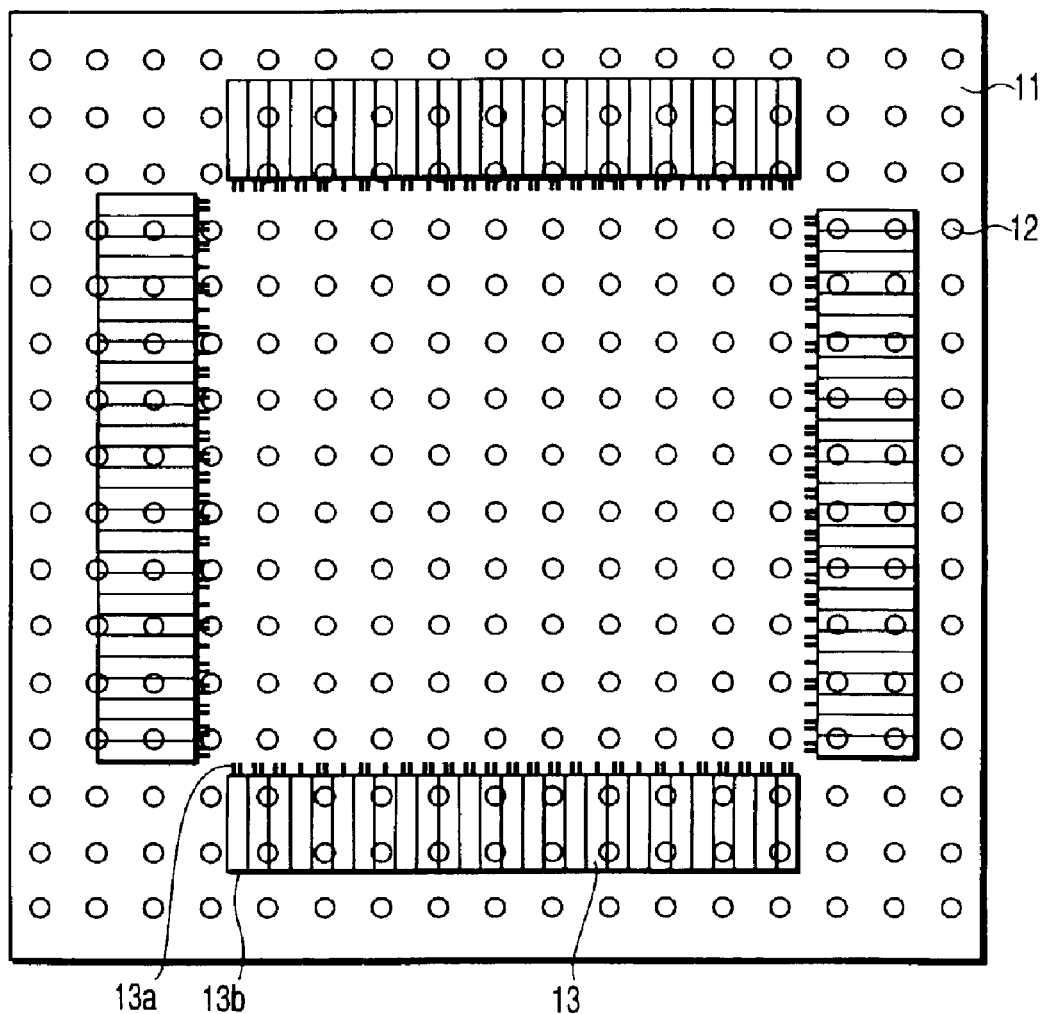
FIG. 16 is a sectional view showing a semiconductor integrated circuit device according to the first prior art.
Figure 17:
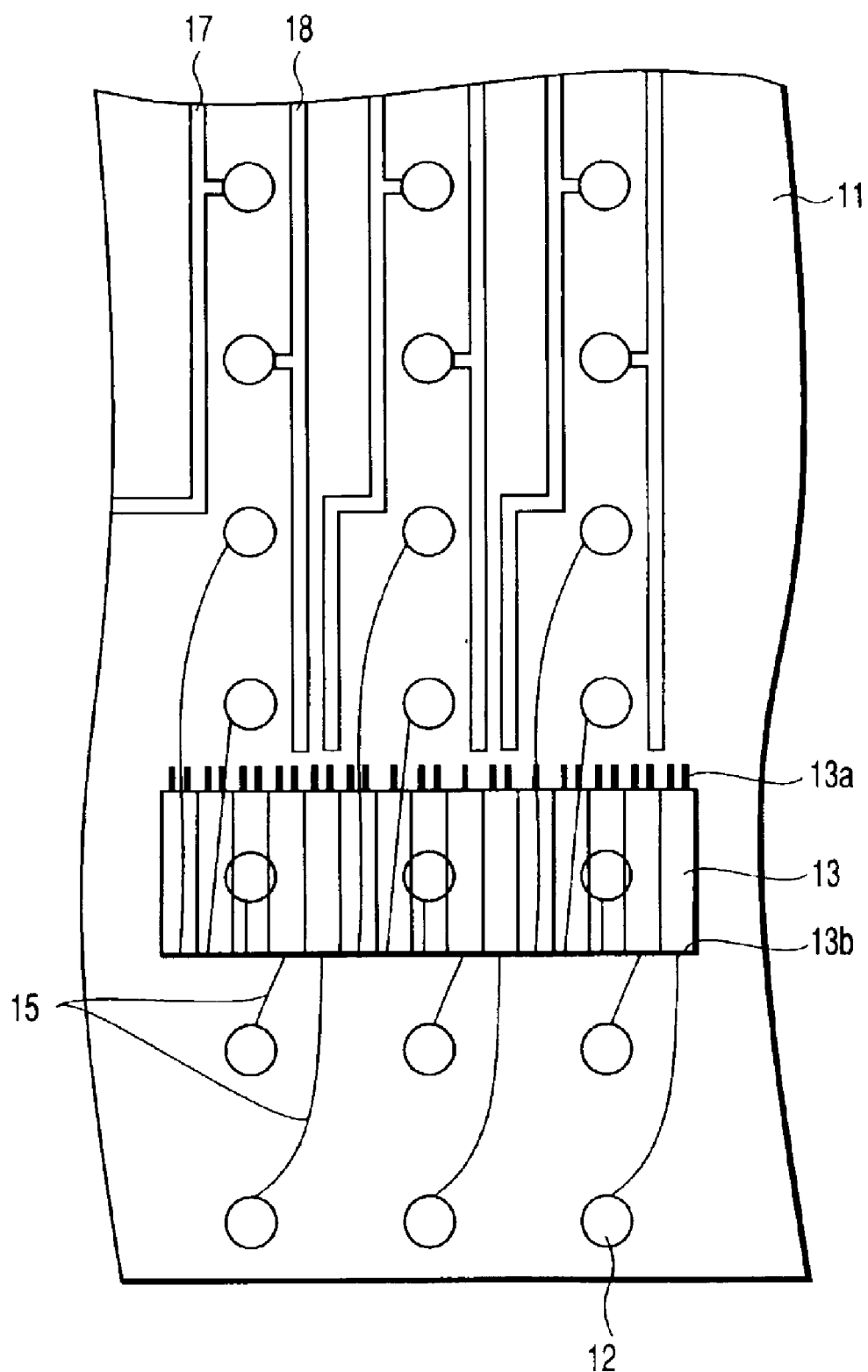
FIG. 17 is a partially enlarged view of the semiconductor integrated circuit device shown in FIG. 16.
Figure 18:
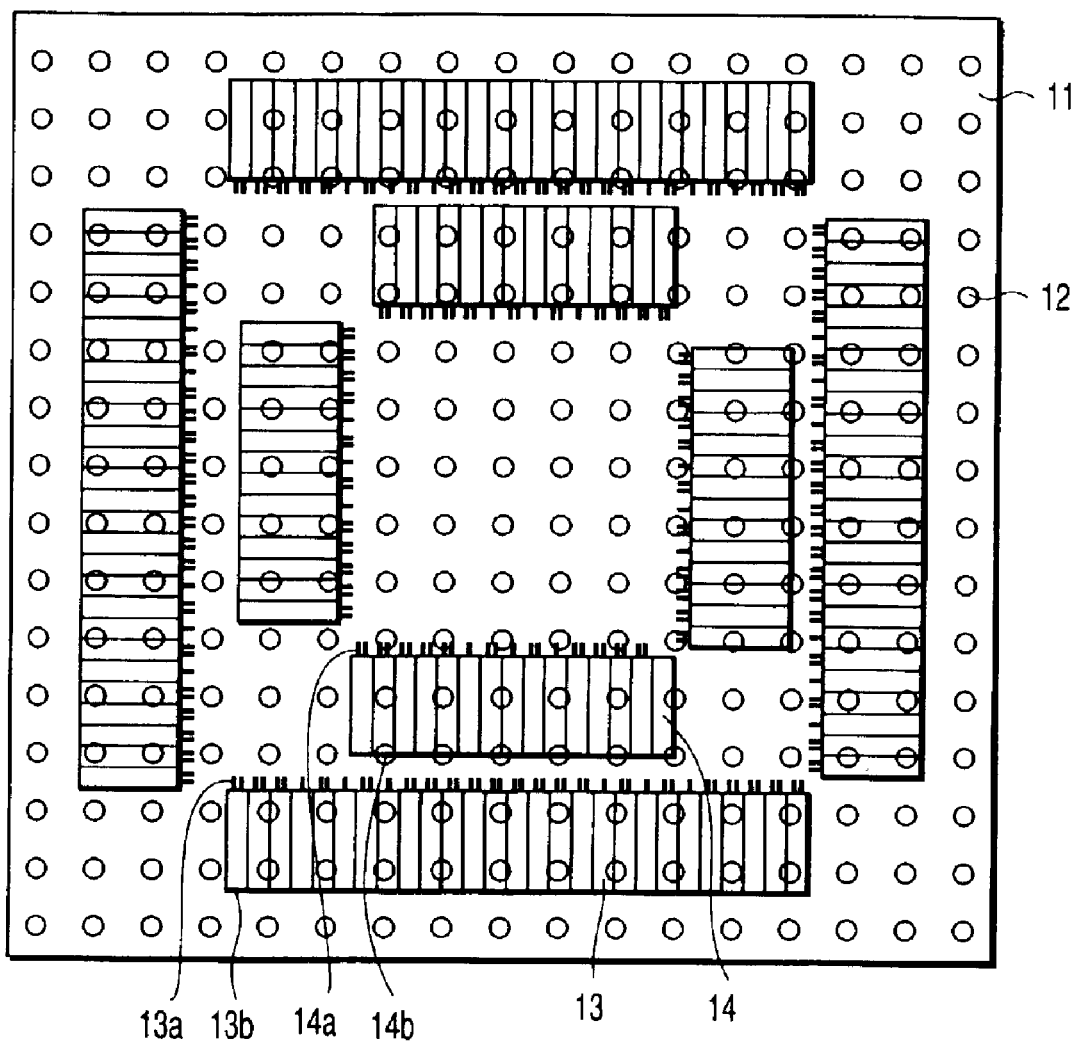
FIG. 18 is a sectional view showing a semiconductor integrated circuit device according to the second prior art.
Figure 19:
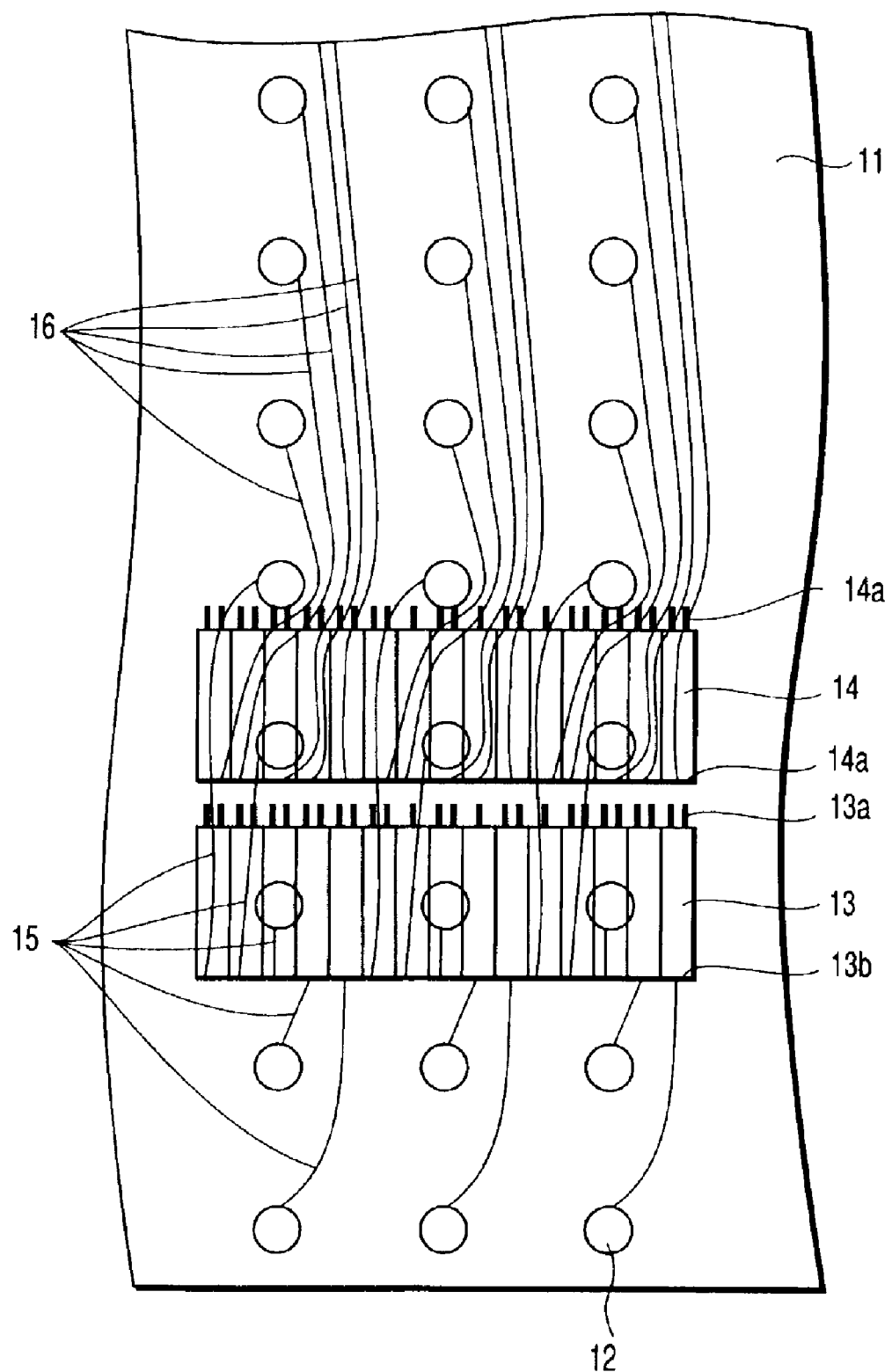
FIG. 19 is a partially enlarged view of the semiconductor integrated circuit device shown in FIG. 18.

FIG. 14 shows a plan view of a semiconductor integrated circuit device according to the sixth embodiment of the present invention. FIG. 15 shows a partially enlarged view of the semiconductor integrated circuit device shown in FIG. 14. Interconnections are omitted in FIG. 14. The flip-chip type semiconductor integrated circuit device according to the sixth embodiment will be described below. In the sixth embodiment, only the structure different from those in the semiconductor integrated circuit devices according to the first and second embodiments will be described.

As shown in FIG. 14, a plurality of so-called staggered pads 12 are formed on an entire chip 11. First and second I/O cells 13 and 14 are arranged on the four sides of the chip 11 such that internal signal terminals 13a of the first I/O cells 13 and internal signal terminals 14a of the second I/O cells 14 face each other.

As shown in FIG. 15, the second I/O cells 14 are arranged with partial gaps on each side of the chip 11. In this case, a distance X2 (e.g., X2=160 µm) between the pads 12 in the row direction when the pads are staggered becomes smaller than a length X1 (e.g., X1=226 µm) between pads 12 in the row direction when the lattice pads are arranged at an equal interval in a matrix (FIG. 7). With this structure, the gaps in the second I/O cells 14 are formed in the gaps between every other rows, i.e., the space between the pads in the first and second rows, and the space between the pads in the third and fourth rows. In other words, one power supply interconnection 17 and one ground interconnection 18 are commonly used by pads in two rows. That is, the hatched power supply interconnection 17 and ground interconnection 18 in FIG. 15 supply a power supply voltage and ground potential to the 12th hatched I/O cells 13 and 14 shown in FIG. 15.

The power supply interconnections 17 and ground interconnections 18 for an internal circuit run from the center of the chip 11 to the vicinity of the internal signal terminals 13a of the first I/O cells 13 via the gaps in the second I/O cells 14. Although not shown, the power supply interconnections 17 and ground interconnections ground interconnections 18 are connected to the first and second I/O cells 13 and 14. The power supply interconnections 17 and ground interconnections 18 are used for supplying a power supply voltage and ground potential to not only the internal circuit but also the first and second I/O cells 13 and 14.

According to the sixth embodiment, even when the pads 12 are staggered, the same effects as in the first and second embodiments can be obtained.

Note that in FIGS. 14 and 15, the sixth embodiment applies the structure based on that of the second embodiment, but may apply the structure based on that of the first embodiment. The structure of the third embodiment can be similarly applied to the sixth embodiment.

Additional advantages and modifications will readily occur to those skilled in the art. Therefore, the invention in its broader aspects is not limited to the specific details and representative embodiments shown and described herein. Accordingly, various modifications may be made without departing from the spirit and scope of the general inventive concept as defined by the appended claims and their equivalents.

What is claimed is:

1. A semiconductor integrated circuit device comprising:

a chip;

connection members arranged on said entire chip and connected to an external circuit of said chip;

a first I/O cell which is arranged on a periphery of said chip and has a first end portion on a peripheral side of said chip and a second end portion on a center side of said chip;

a second I/O cell which is arranged inside said first I/O cell and has a third end portion on the peripheral side of said chip and a fourth end portion on the center side of said chip;

first terminals formed on the first end portion and connected to said connection members;

second terminals formed on the second end portion and connected to and internal circuit of said chip;

third terminals formed on the third end portion and connected to the internal circuit of said chip, both the second and third terminals disposed along a direction extending from the first end portion to the second end portion and opposed to each other;

fourth terminals formed on the fourth end portion and connected to said connection members;

a first ESD protective element provided in the first I/O cell and connected to the first terminal; and a second ESD protective element provided in the second I/O cell and connected to the fourth terminal.

2. The disk apparatus according to claim 1, wherein
said first I/O cell comprises a plurality of first I/O cells which are arranged to be adjacent to each other on each side of said chip, and
said second I/O cell comprises a plurality of second I/O cells which are arranged to be adjacent to each other on each side of said chip.

3. A device according to claim 2, wherein
said plurality of second I/O cells are arranged with a partial gap.

4. A device according to claim 3,
at least one of a power supply interconnection which connects said first and second I/O cells to a power supply, and a ground interconnection which connects said first and second I/O cells to ground runs from a center of said chip to the gap in said second I/O cells.

5. A device according to claim 1, wherein
said second terminals face said third terminals.

6. A device according to claim 1, wherein
said connection members are staggered or arranged in a matrix on an entire surface of said chip.

7. A device according to claim 1, wherein
said first terminals are arranged on a center of said first I/O cell.

8. A device according to claim 1, wherein
said fourth terminals are arranged on a center of said second I/O cell.

9. A device according to claim 1, further comprising:
a third I/O cell which is arranged inside said second I/O cell and has a fifth end portion on the peripheral side of said chip and a sixth end portion on the center side of said chip;
a fourth I/O cell which is arranged inside said third I/O cell and has a seventh end portion on the peripheral side of said chip and an eighth end portion on the center side of said chip;
fifth terminals formed on the fifth end portion and connected to said connection members;
sixth terminals formed on the sixth end portion and connected to the internal circuit of said chip;
seventh terminals formed on the seventh end portion and connected to the internal circuit of said chip; and
eighth terminals formed on the eighth end portion and connected to said connection members.

10. A device according to claim 9, wherein
said first I/O cell comprises a plurality of first I/O cells which are arranged to be adjacent to each other on each side of said chip,
said second I/O cell comprises a plurality of second I/O cells which are arranged to be adjacent to each other on one side of said chip,
said third I/O cell comprises a plurality of third I/O cells which are arranged to be adjacent to each other in said one side of said chip, and
said fourth I/O cell comprises a plurality of fourth I/O cells which are arranged to be adjacent to each other in said one side of said chip.

11. A device according to claim 10, wherein
each of said second to fourth I/O cells are arranged with a partial gap.

12. A device according to claim 9, wherein
said sixth terminals face said seventh terminals.

13. A device according to claim 9, wherein
said second I/O cell is spaced apart from said third I/O cell by a predetermined distance, and
said connection members located between said second and third I/O cells are respectively connected to a power supply interconnection and a ground interconnection.

14. A device according to claim 13, wherein
said power supply interconnection and said ground interconnection run from said connection members located between said second and third I/O cells to a gap in said second I/O cell, and run to a gap of said third and fourth I/O cells.

15. A device according to claim 13, wherein
a region between said second and third I/O cells includes a region in which the internal circuit of said chip is present.

16. A device according to claim 1, wherein
a macrocell is arranged to be adjacent to said first or second I/O cell.

17. A device according to claim 16, wherein
said macrocell has ninth terminals and $10^{th}$ terminals,
the ninth terminals are formed on an end portion on the center side of said chip and connected to the internal circuit of said chip, and
the 10th terminals are formed on an end portion on the peripheral side of said chip and connected to said connection members.

* * * * *